(12) United States Patent
Lim et al.

(10) Patent No.: US 7,965,470 B2
(45) Date of Patent: Jun. 21, 2011

(54) INFORMATION STORAGE DEVICE USING MOVEMENT OF MAGNETIC DOMAIN WALL, AND METHODS OF MANUFACTURING AND OPERATING THE INFORMATION STORAGE DEVICE

(75) Inventors: Chee-kheng Lim, Suwon-si (KR); Sung-hoon Choa, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1001 days.

(21) Appl. No.: 11/781,311

(22) Filed: Jul. 23, 2007

(65) Prior Publication Data
US 2008/0138661 A1    Jun. 12, 2008

(30) Foreign Application Priority Data
Dec. 6, 2006  (KR) .......................... 10-2006-0123394

(51) Int. Cl.
*G11B 5/33*    (2006.01)
(52) U.S. Cl. .......................................... 360/131; 365/80
(58) Field of Classification Search ...................... 365/80
See application file for complete search history.

(56) References Cited

U.S. PATENT DOCUMENTS

| | | | | |
|---|---|---|---|---|
| 5,699,213 | A * | 12/1997 | Ohyama et al. | 360/327.32 |
| 6,741,524 | B2 * | 5/2004 | Ichihara et al. | 369/13.01 |
| 7,221,538 | B2 * | 5/2007 | Kawato et al. | 360/125.04 |
| 7,330,335 | B2 * | 2/2008 | Kikitsu et al. | 360/125.03 |
| 7,508,626 | B2 * | 3/2009 | Ichihara et al. | 360/125.06 |
| 7,869,264 | B2 * | 1/2011 | Lee et al. | 365/158 |
| 7,879,466 | B2 * | 2/2011 | Takahashi et al. | 428/829 |
| 2007/0206335 | A1 * | 9/2007 | Freitag et al. | 360/324.12 |

OTHER PUBLICATIONS

Chinese Office Action dated Jul. 7, 2010 and English translation thereof.

* cited by examiner

*Primary Examiner* — Mark Blouin
(74) *Attorney, Agent, or Firm* — Harness, Dickey & Pierce, P.L.C.

(57) ABSTRACT

Provided are an information storage device using movement of a magnetic domain wall, and methods of manufacturing and operating the information storage device. The information storage device includes a storage track having magnetic domains and a writer for recording data to the storage track, wherein the writer comprises: a first magnetic layer and a second magnetic layer that is formed to cover a portion of the first magnetic layer and has a smaller magnetic anisotropic energy than the first magnetic layer.

33 Claims, 12 Drawing Sheets

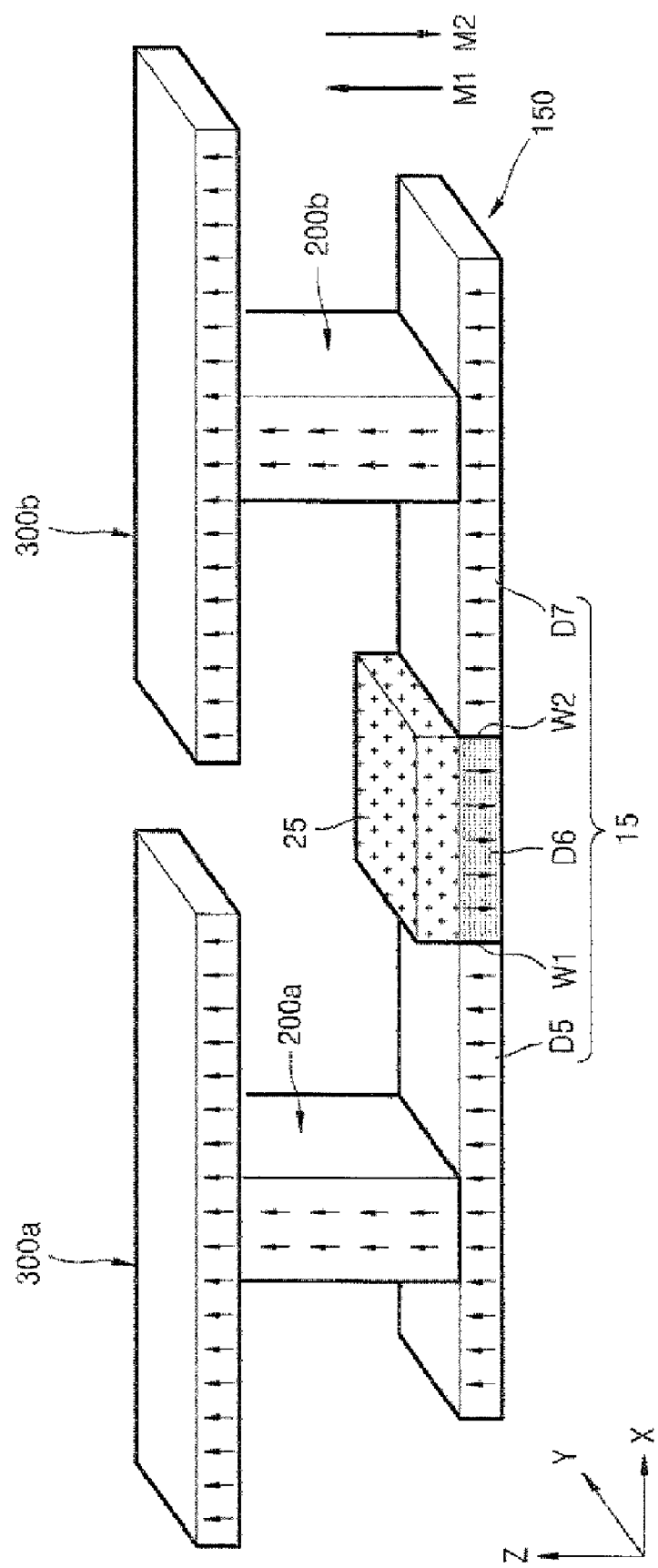

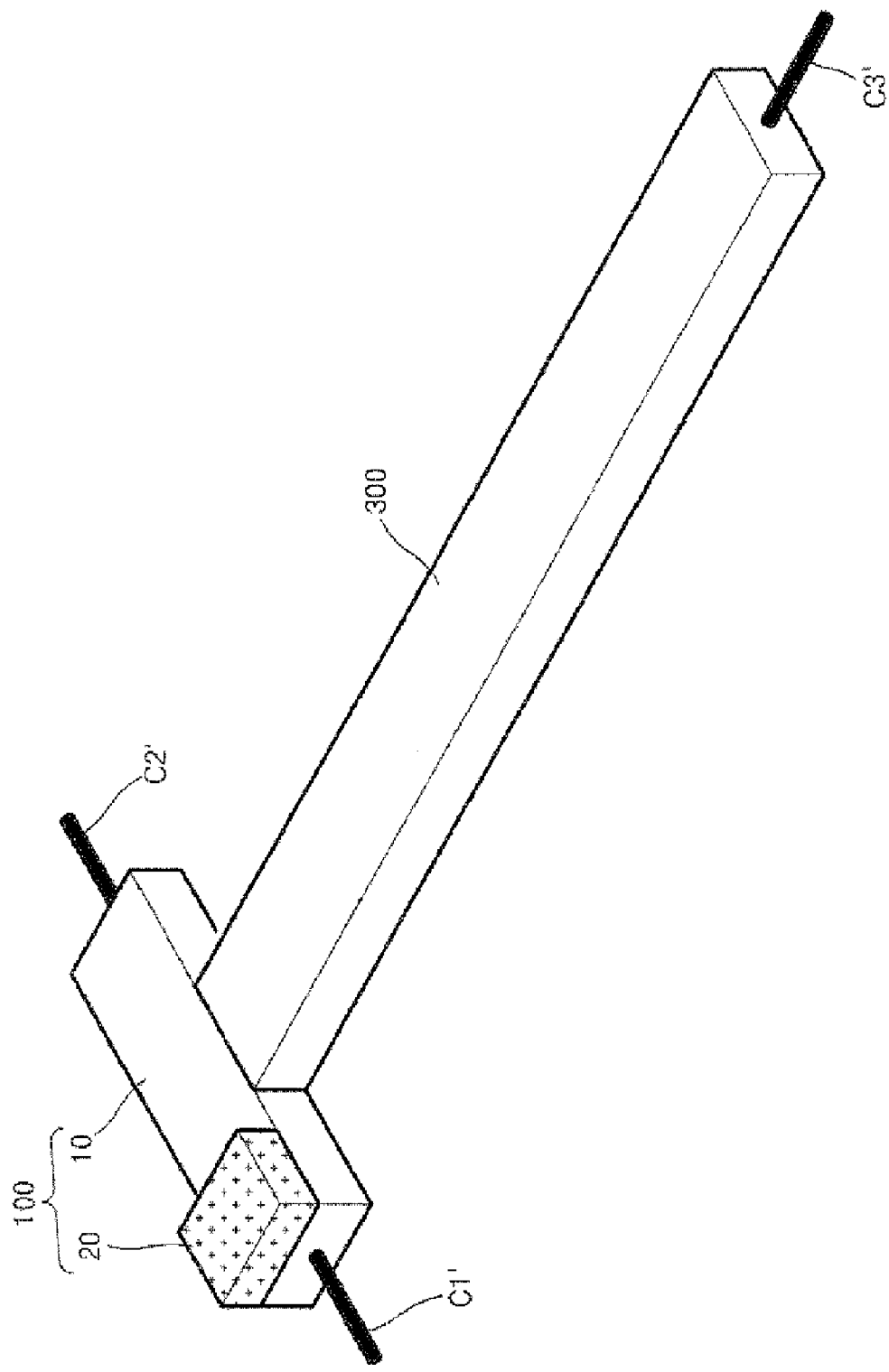

INFORMATION STORAGE DEVICE USING MOVEMENT OF MAGNETIC DOMAIN WALL, AND METHODS OF MANUFACTURING AND OPERATING THE INFORMATION STORAGE DEVICE

CROSS-REFERENCE TO RELATED PATENT APPLICATION

This application claims the benefit of Korean Patent Application No. 10-2006-0123394, filed on Dec. 6, 2006 in the Korean Intellectual Property Office, the disclosure of which is incorporated herein in its entirety by reference.

BACKGROUND OF THE INVENTION

1. Field of the Invention

The present invention relates to an information storage device, and more particularly, to an information storage device using movement of a magnetic domain wall, and methods of manufacturing and operating the information storage device.

2. Description of the Related Art

A general hard disk drive (HDD) is a device that reads and writes information by rotating a magnetic recording medium in a disk form and moving a reading/writing head along the magnetic recording medium. HDDs are non-volatile data storage devices capable of storing data of 100 gigabytes (GB) or more and are used mostly as a main storage device in computers.

However, a HDD includes a lot of moving mechanic systems. These mechanic systems may cause various mechanic faults when the HDD is moved from one location to another location, or affected by shock, thereby decreasing mobility and reliability of the HDD. Also, these mechanic systems increase the complexity and costs of the manufacture of the HDD, increase the power consumption, and generate noise. In particular, the increased complexity and costs of manufacturing HDDs become more serious when the HDDs are minimized.

Thus, recently, a research to provide a new storage device, which does not include moving mechanism systems, but allows a storage of information as large as a HDD, is under progress. As an example, a data storage device using the moving principle of a magnetic domain wall moving in a magnetic material has been suggested.

Magnetic minute regions constituting a magnetic body are called magnetic domains. In a magnetic domain, the direction of the magnetic moment is identical. The size and the magnetization direction of the magnetic domains and the direction of the magnetization can be appropriately controlled by varying or controlling the property, shape and size of the magnetic material, and external energy. A magnetic domain wall is a boundary between neighboring magnetic domains each having different magnetization directions, and can be moved by a current or a magnetic field applied to the magnetic material. When the principle of movement of the magnetic domain wall is applied to an information storage device, it is possible to move the magnetic domains to pass through fixed reading/writing heads in a controlled manner by the movement or propagation of the magnetic domain wall, and thus data can be read/written without the rotation of the recording medium. The information storage device employing the principle of movement of the magnetic domain wall can store a large amount of data and at the same time does not include moving mechanical systems, thereby avoiding disadvantages associated with the moving mechanical systems. Thus, such storage device may have an excellent mobility and reliability, can easily be manufactured, and consumes less power.

However, information storage devices using movements of the magnetic domain wall are still at the initial stages of research and further research and developments are needed in order to put them into practical use.

The conventional writing method can be divided into a method using an external magnetic field and a method using spin torque of electrons. The writing method using an external magnetic field cannot is not applicable to a magnetic layer storage medium which has a high magnetic anisotropic energy. When a soft magnetic layer such as a NiFe layer is used as a storage medium, it is difficult to secure stability of the movement of the magnetic domain wall and to realize high recording density. Meanwhile, the method using spin torque of electrons cannot be applied to a magnetic layer which has a thickness of greater than about 3 nm. Thus, the writing method using the spin torque of the electrons cannot be applied to a perpendicular magnetic recording storage device which requires a magnetic layer having a thickness of about 100 nm or greater.

SUMMARY OF THE INVENTION

The present invention provides an information storage device using movement of a magnetic domain wall in which a recording operation can be performed independent of the property or dimension of a magnetic layer in which data is to be recorded.

The present invention also provides a method of manufacturing the information storage device.

The present invention also provides a method of operating the information storage device.

According to an aspect of the present invention, there is provided an information storage device using movement of a magnetic domain wall comprising: a storage track having magnetic domains which each have a magnetization direction and a writer which records data to the storage track, wherein the writer comprises: a first magnetic layer; and a second magnetic layer that is formed to be in contact with a portion of the first magnetic layer and has a smaller magnetic anisotropic energy than the first magnetic layer. The information storage device may further comprise a third layer which is disposed between the storage track and the writer; which is in contact with a portion of the storage track and with a portion of the writer; and which has a smaller magnetic anisotropic energy than the storage track and the first magnetic layer.

The information storage device may be a laminate of the storage track, the third layer, and the writer.

The information storage device may be in a form of a single layer, in which the storage track, the third layer, and the writer are arranged on a single layer.

The magnetization direction of the portion of the first magnetic layer, where the first magnetic layer is in contact with the second magnetic layer is opposite to a magnetization direction of a rest of the first magnetic layer where the second magnetic layer is not in contact, and the first magnetic layer may have a magnetic domain wall moving characteristic.

A plurality of identical second magnetic layers may be formed, and the number of magnetic domains included in the first magnetic layer may vary according to the number of the second magnetic layers.

The second magnetic layer may be formed at an end of the first magnetic layer, and the first magnetic layer may have two magnetic domains magnetized in opposite directions to each other.

The second magnetic layer may be formed in the center of the first magnetic layer and the first magnetic layer may have three magnetic domains.

At least two second magnetic layers may be formed, and the first magnetic layer may have at least four magnetic domains.

The portion of the first magnetic layer on which the second magnetic layer is formed may have a greater width than the portion of the first magnetic layer where the second magnetic layer is not formed.

At least one of a first end and a second end of the first magnetic layer may have a greater width than the remaining region of the first magnetic layer except for the first end and the second end.

The magnetic anisotropic energy of the first magnetic layer may be $2 \times 10^3$-$10^7$ J/m$^3$.

The magnetic anisotropic energy of the second magnetic layer maybe 10-$10^3$ J/m$^3$.

The second magnetic layer may be formed of one of Ni, Co, NiCo, NiFe, CoFe, CoZrNb, and CoZrCr.

The thickness of the second magnetic layer may be 5-100 nm.

The second magnetic layer may be formed on or under the first magnetic layer.

A plurality of structures each comprises the storage track and the writer, wherein the first magnetic layers are identical to each other and the structure may be arranged parallel. A portion of each of the first magnetic layers may have a greater width than the rest of the first magnetic layer and may be in contact with one another, and the second magnetic layer may be formed on the portions of the first magnetic layers and covers the portions.

The information storage device may further comprise a current applying device connected to the storage track and the writer.

According to another aspect of the present invention, there is provided a method of manufacturing an information storage device using movement of a magnetic domain wall, comprising a storage track having magnetic domains which each have a magnetization direction; and a writer which records data to the storage track, which comprises forming the writer; and forming the storage track, wherein forming the writer comprises forming a first magnetic layer; and forming a second magnetic layer which is provided to be in contact with a portion of the first magnetic layer and has a smaller magnetic anisotropic energy than the first magnetic layer.

The method may further comprise, after forming the first and second magnetic layers: applying a first magnetic field to the first and second magnetic layers; and applying a second magnetic field that is opposite in direction to the first magnetic field and is smaller in intensity than the first magnetic field to the first and second magnetic layers.

The first magnetic field may magnetize the first magnetic layer in a first direction, and the second magnetic field may magnetize the portion of the first magnetic layer, where the first magnetic layer is in contact with the second magnetic layer, in a second direction that is opposite to the first direction.

The magnetic field may have an intensity of selectively reversing the magnetization direction of the portion of the first magnetic layer covered by the second magnetic layer.

The magnetic anisotropic energy of the first magnetic layer may be $2 \times 10^3$-$10^7$ J/m$^3$.

The magnetic anisotropic energy of the second magnetic layer may be 10-$10^3$ J/m$^3$.

The second magnetic layer may be formed of one of Ni, Co, NiCo, NiFe, CoFe, CoZrNb, and CoZrCr.

According to another aspect of the present invention, there is provided a method of operating an information storage device using movement of a magnetic domain wall comprising: a storage track having magnetic domains which each have a magnetization direction; and a writer which records data to the storage track, wherein the writer comprises a first magnetic layer; and a second magnetic layer which is provided to be in contact with a portion of the first magnetic layer and has a smaller magnetic anisotropic energy than the first magnetic layer, the method comprising: forming a magnetic domain wall in the first magnetic layer; (b) applying a first current to the first magnetic layer to move the magnetic domain wall; and (c) applying a second current to the writer through the storage track.

The step (a) may comprise: applying a first magnetic field to the first and second magnetic layers; and applying a second magnetic field that is opposite in direction to the first magnetic field and is smaller in intensity than the first magnetic field to the first and second magnetic layers.

The first magnetic field may magnetize the first magnetic layer in a first direction, and the second magnetic field may magnetize the portion of the first magnetic layer, where the first magnetic layer is in contact with the second magnetic layer in a second direction that is opposite to the first direction.

The step (a) may comprise: applying a magnetic field to the first and second magnetic layers.

The magnetic field may have a direction and an intensity which selectively reverse the magnetization direction of the portion of the first magnetic layer, where the first magnetic layer is in contact with the second magnetic layer selectively.

BRIEF DESCRIPTION OF THE DRAWINGS

The above and other features and advantages of the present invention will become more apparent by describing in detail exemplary embodiments thereof with reference to the attached drawings in which:

FIG. 3 is a perspective view illustrating an information storage device according to another embodiment of the present invention;

FIG. 7 depicts an information storage device according to an exemplary embodiment, in which a writer and a storage track are formed on a single layer.

DETAILED DESCRIPTION OF THE INVENTION

Figure 1:
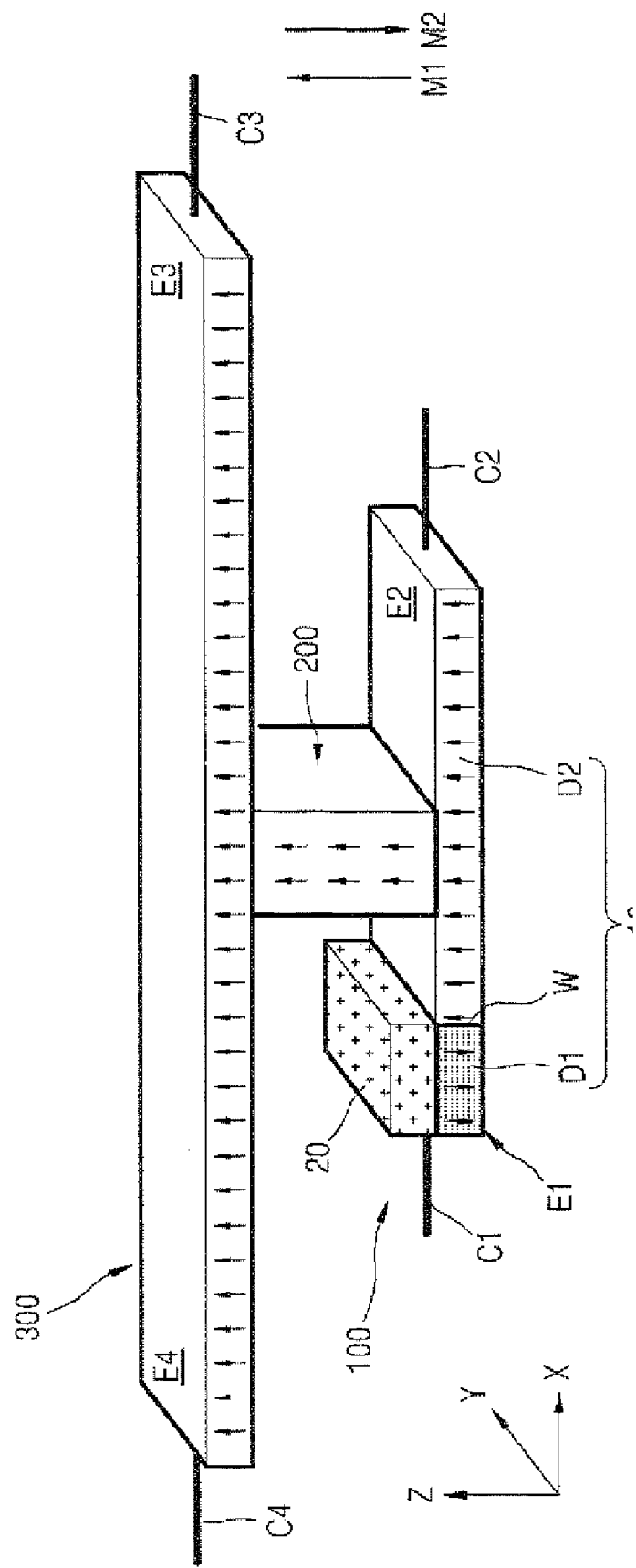
FIG. 1 is a perspective view illustrating an information storage device according to an embodiment of the present invention.

The present invention will now be described more fully with reference to the accompanying drawings, in which exemplary embodiments of the invention are shown. In the drawings, the thicknesses of layers and regions are exaggerated for clarity.

FIG. 1 is a perspective view illustrating an information storage device according to an exemplary embodiment of the present invention.

Referring to FIG. 1, the information storage device includes a storage track 300 formed of a ferromagnetic material and a writer 100 for writing data on the storage track 300. An intermediate layer 200 formed of a soft magnetic layer is disposed between the writer 100 and the storage track 300. The intermediate layer 200 is in direct contact with a portion of the storage track as well as in direct contact with a portion of the writer 100. The writer 100 and the storage track 300 may be disposed to be parallel to each other or cross one another perpendicularly, in the direction of their lengths. First and second conductive lines C1 and C2 are connected to first and second ends E1 and E2 of the writer 100, respectively, and third and fourth conductive lines C3 and C4 are connected to first and second ends E3 and E4 of the storage track 300, respectively. The first through fourth conductive lines C1 through C4 are for applying currents to the writer 100 and the storage track 300.

The writer 100 includes a first magnetic layer 10 and a second magnetic layer 20 which is formed on a surface of the first magnetic layer 10 and covers a portion of the first magnetic layer 10. The first magnetic layer 10 may be formed of a ferromagnetic material, and the second magnetic layer 20 may be formed of a soft magnetic material having a smaller magnetic anisotropic energy than the first magnetic layer 10. In one embodiment, the intermediate layer 200, which is disposed between the storage track 200 and the writer 100 and is in direct contact with the storage track 200 and the writer 100, may be formed on a portion of the first magnetic layer 10.

The magnetization directions of the portion of the first magnetic layer 10 on which the second magnetic layer 20 is formed and the rest of the region of the first magnetic layer 10 are opposite to each other. That is, the first magnetic layer 10 may have two magnetic domains magnetized in opposite directions, that is, a first magnetic domain D1 and a second magnetic domain D2 as shown in FIG. 1. In FIG. 1, the second magnetic domain D2, the intermediate layer 200, and the storage track 300 are magnetized in a first direction M1, and the first magnetic domain D1 is magnetized in a second direction M2. A magnetic domain wall W is present at a boundary between the first magnetic domain D1 and the second magnetic domain D2. The magnetic domain wall W can be moved in the writer 100 by applying a current to the writer 100 from the first end E1 to the second end E2 of the writer 100, or vice versa. Since the direction of the current and the direction of the movement of electrons are opposite to each other, the magnetic domain wall W moves in the opposite direction to the direction of the current. The writer 100 will be described in detail later.

The magnetization direction of the intermediate layer 200 can be switched according to the change of the position of the magnetic domain wall W. The magnetization direction of the intermediate layer 200 may be switched to be identical to that of the portion of the first magnetic layer 10 which is in contact with to the intermediate layer 200 because the intermediate layer 200 is formed of a soft magnetic layer that can be easily reversed in magnetization.

When the magnetization direction of the intermediate layer 200 is reversed, the magnetization direction of the portion of the storage track 300, which portion is in contact with the intermediate layer 200, may become the same as the magnetization direction of the intermediate layer 200. That is, the magnetization direction of the portion of the storage track 300, which portion is in contact with the intermediate layer 200, may be reversed to be the same as the magnetization direction of the intermediate layer 200. This is because it is more stable when the magnetization direction of the portion of the intermediate layer 200 and the magnetization direction of the portion of the storage track 300, which portions are in contact with the intermediate layer 200, are the same than when the magnetization directions are not the same. The movement of the magnetic wall W in the writer 100 may effectively cause the reversals of the magnetization directions of the intermediate layer 200 and the portion of the storage track 300, where it is in contact with the intermediate layer 200. The reversal of the magnetization direction of the portion of the storage track 300, where it is in contact with the intermediate layer 200 creates a magnetic wall(s) in the storage track 300, which may be moved along the storage track 300 by applying a current to the storage track 300 or to the writer 100, which results a writing of information onto the storage track 300, as will be described below. The magnetic anisotropic energy of the first magnetic layer 10 of the writer 100 may be greater than the magnetic anisotropic energy of the storage track 300.

Though not illustrated in FIG. 1, a reading head used in a typical magnetic recording device may be formed on a predetermined region of the storage track 300. In one exemplary embodiment, a laminate of a plural intermediate layer 200 and a plural storage track 300 may be formed on the writer 100 in a manner in which the intermediate layer 200 and the storage track 300 are stacked alternately. In addition, a portion of the storage track 300 may be used as a buffer region for temporary data storage during reading/writing operations.

Hereinafter, a writing method of the information storage device according to the current embodiment will be described.

FIGS. 2A through 2D are perspective views illustrating a writing method of the information storage device of FIG. 1 according to the current embodiment of the present invention.

Figure 2A:
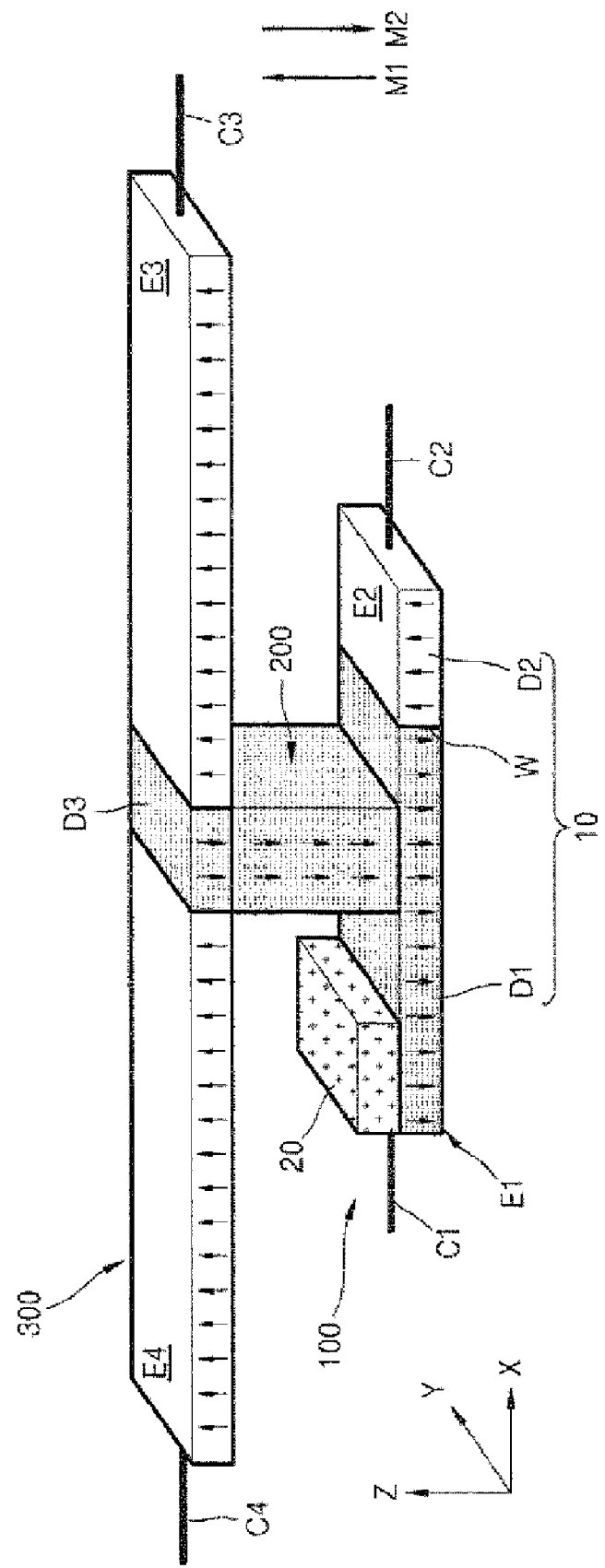
FIGS. 2A through 2D are perspective views illustrating a writing method of the information storage device of FIG. 1, according to an embodiment of the present invention.

FIG. 2A illustrates a result of moving the magnetic domain wall W of the information storage device of FIG. 1. Referring to FIG. 2A, a current is applied from a second end E2 to a first end E1 of the first magnetic layer 10, thereby moving the magnetic domain wall W in a direction from the first end E1 to the second E2. Thus the first magnetic domain D1, which has a magnetization direction M2, is extended to the area where the first magnetic layer 10 is in contact with the intermediate layer 200. As the magnetic domain wall W moves, the magnetization direction of the intermediate layer 200 is reversed from M1 into a second direction M2. Then the magnetization direction of a portion of the storage track 300, where the storage track 300 is in contact with the intermediate layer 200, is also reversed from M1 into the second direction M2. As a result, a magnetic domain D3 (hereinafter "the third magnetic domain D3") is formed in the storage track 300.

Figure 2B:
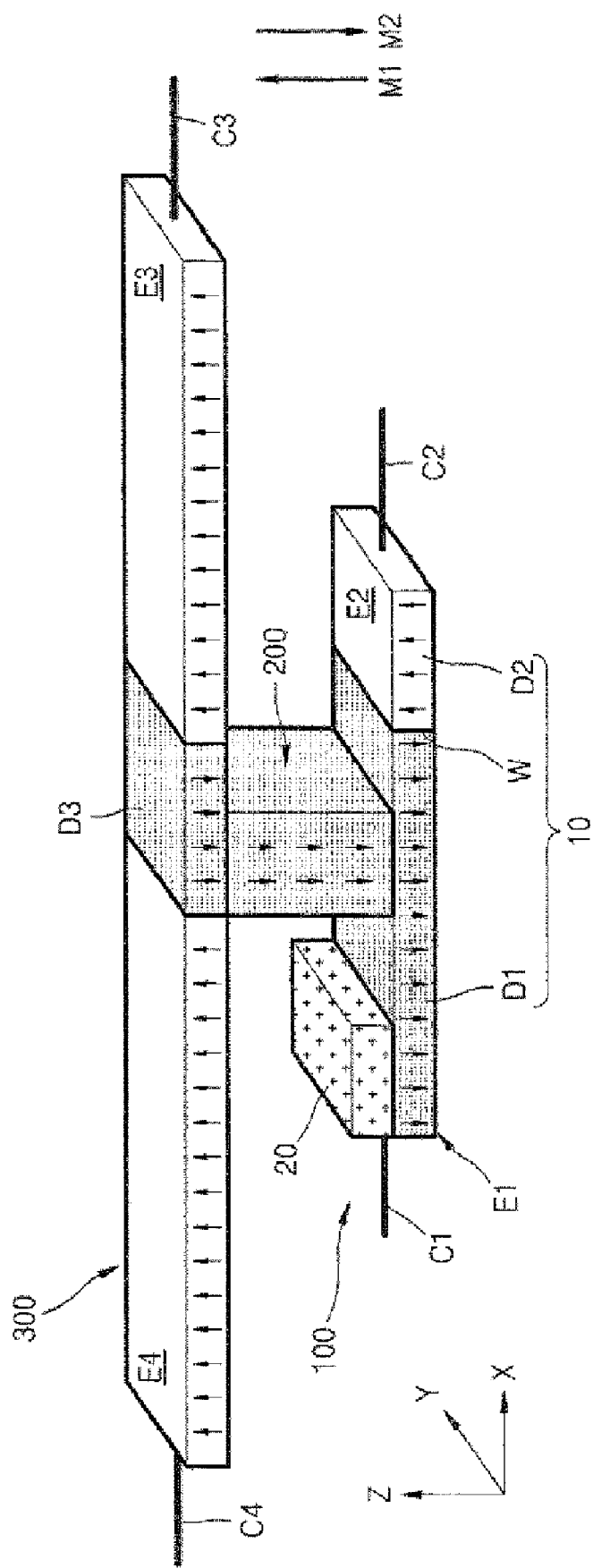

Referring to FIG. 2B, a current is applied from the first end E3 of the storage track 300 to the first magnetic layer 10, thereby extending the third magnetic domain D3 to the first end E3 of the storage track 300 by one bit. Data corresponding to the third magnetic domain D3 may be, for example, '0'.

Figure 2C:
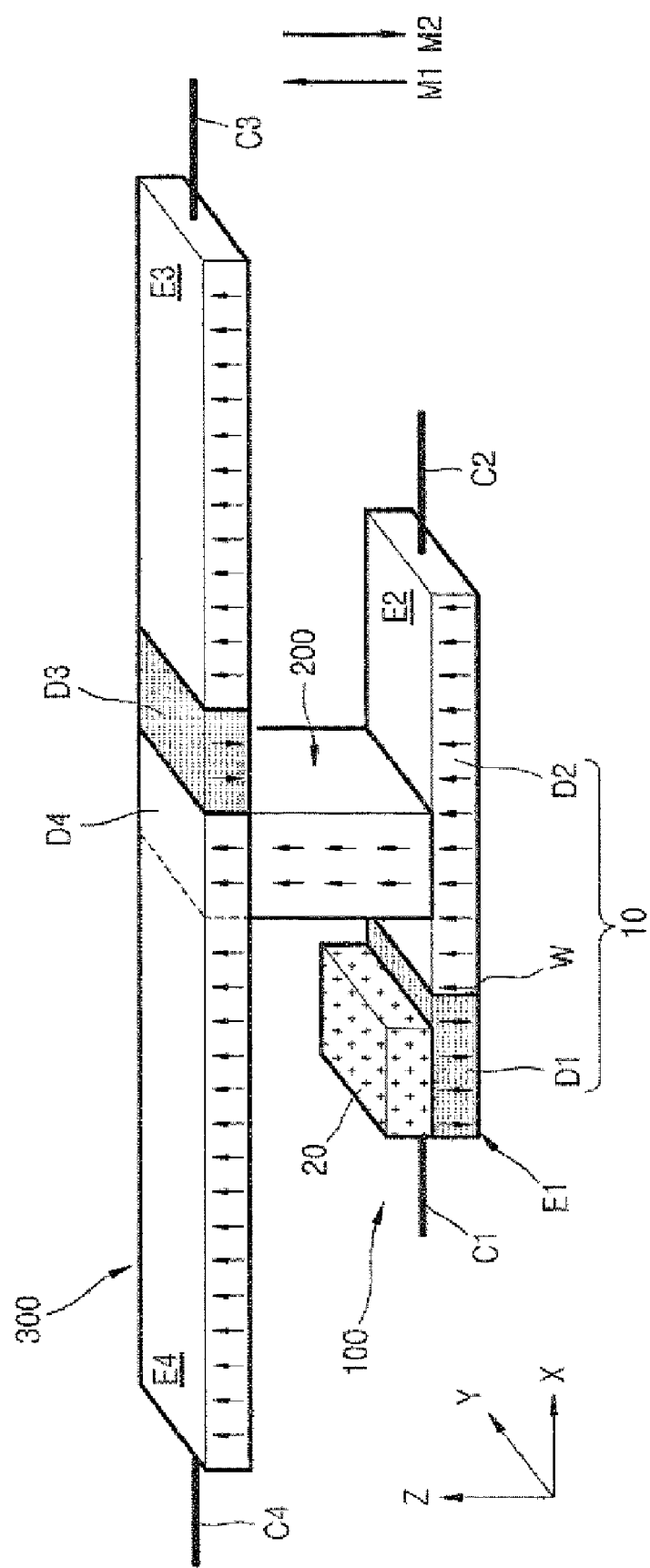

Referring to FIG. 2C, a current is applied from the first end E1 to the second end E2 of the first magnetic layer 10 to move the magnetic domain wall W in a direction from the second end E2 to the first end E1. Thus the second magnetic domain D2 is extended to the area where the first magnetic layer is in contact with the intermediate layer 200. As the magnetic domain wall W moves, the magnetization directions of the intermediate layer 200 and the portion of the storage track 300, where the storage track 300 is in contact with the intermediate layer 200, are reversed from M2 into the first direction M1. A magnetic domain in the portion of the storage track 300, where the storage track 300 is in contact with the intermediate layer 200, is referred to as a fourth magnetic domain D4. Data corresponding to the fourth magnetic domain D4 may be, for example, '1'.

Figure 2D:
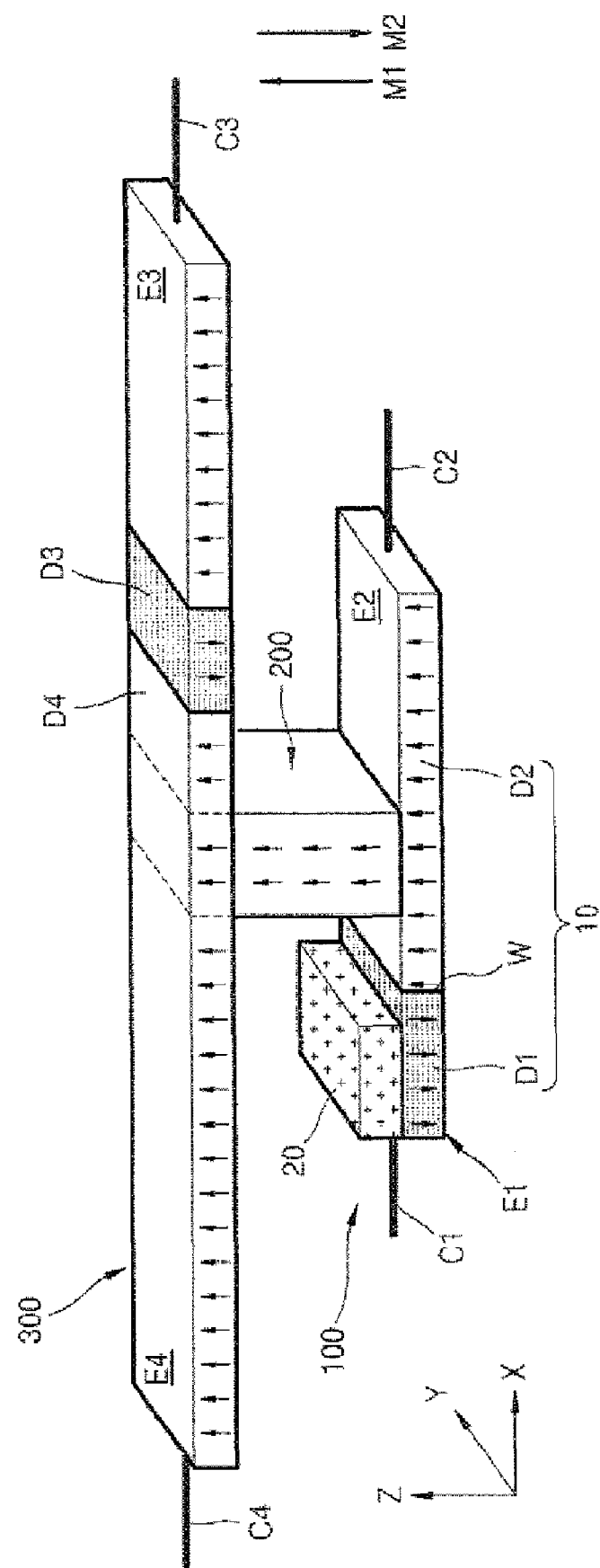
Figure 4A:
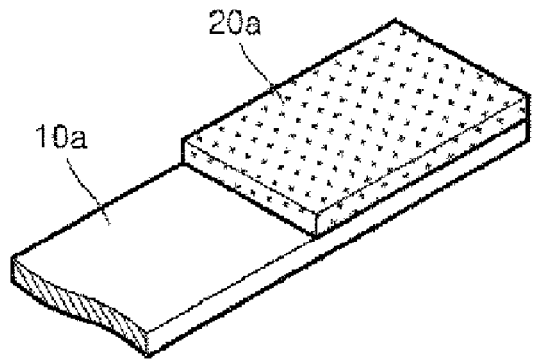
FIGS. 4A through 4F are perspective views illustrating a portion of a writer that can be included in an information storage device of the present invention, according to an embodiment of the present invention.
Figure 4B:
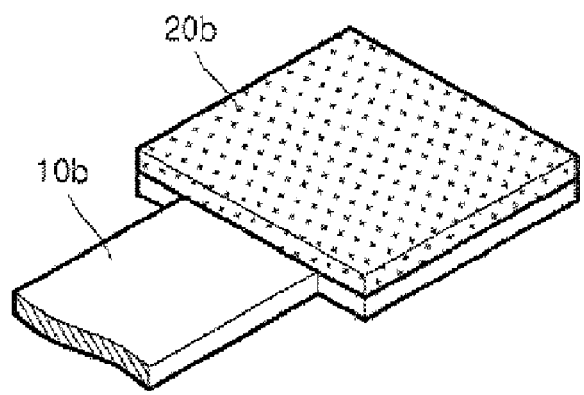
Figure 4C:
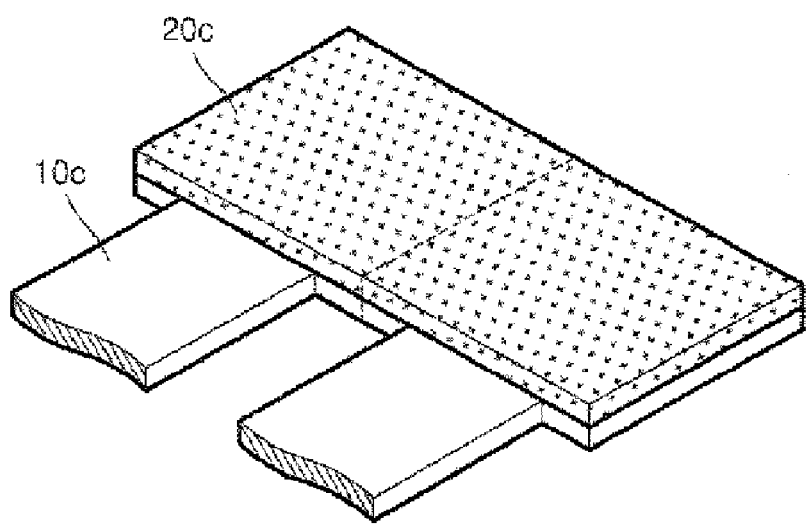
Figure 4D:
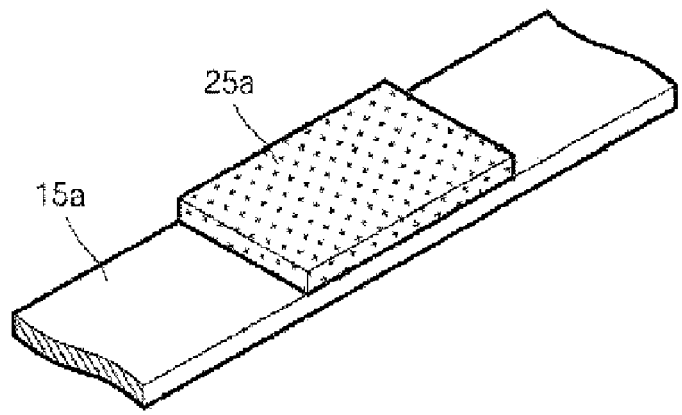
Figure 4E:
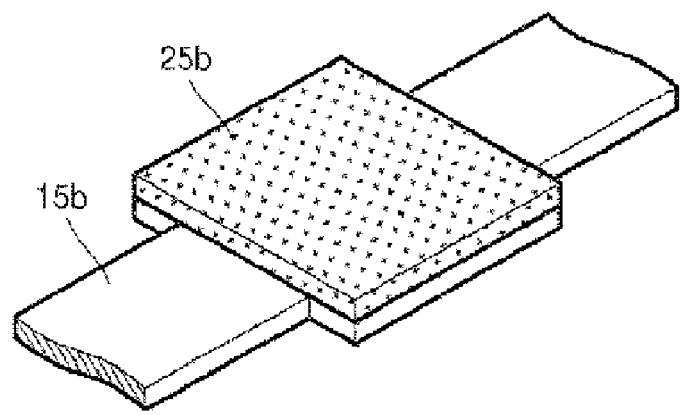
Figure 4F:
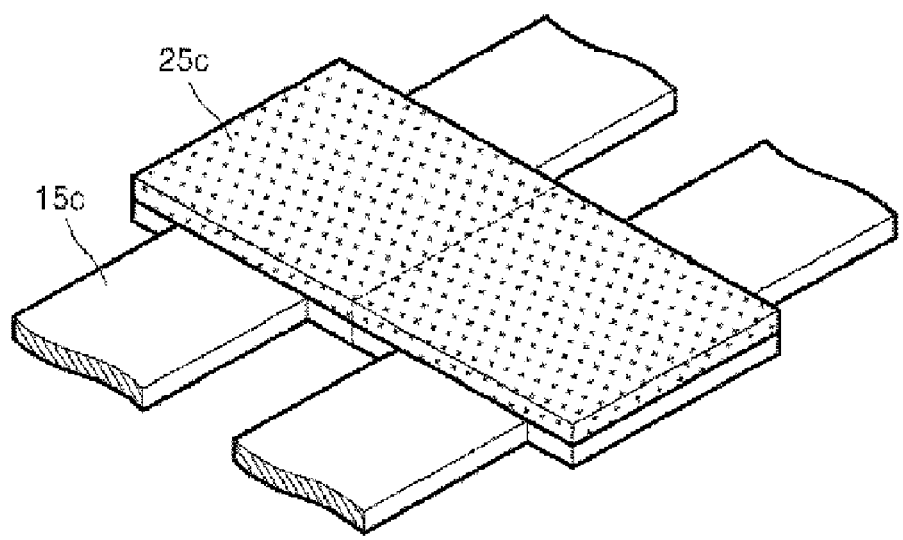

Referring to FIG. 2D, a current is applied from the first end E3 of the storage track 300 to the first magnetic layer 100 to move the third and fourth magnetic domains D3 and D4 toward the first end E3 by one bit.

Thus the information storage device according to the current embodiment of the present invention records data by moving a magnetic domain wall W in the first magnetic layer 10 and, thus, magnetic domains in the storage track 300. The writing operation using the movement of the magnetic domain wall W is performed by controlling the flow of a current. Thus the writing operation of the information storage device according to the current embodiment of the present invention may be free from limitations such as the property or the dimension of the magnetic layer to which data is to be recorded.

Hereinafter, the writer 100 included in the information storage device according to the current embodiment of the present invention will be described in detail.

In order to manufacture and operate the information storage device according to the current embodiment of the present invention, the first and second magnetic domains D1 and D2 need to be formed in the first magnetic layer 10, and the magnetic domain wall W should not disappear when the magnetic domain wall W is moving. To this end, the second magnetic layer 20 is formed to cover a portion of the first magnetic layer 10. The second magnetic layer 20 is not in contact with any part of the storage track 300.

The magnetic anisotropic energy of the first magnetic layer 10 may be $2 \times 10^3$-$10^7$ J/m$^3$, preferably, $10^4$-$10^7$ J/m$^3$. The magnetic anisotropic energy of the second magnetic layer 20 may be 10-$10^3$ J/m$^3$, and preferably $10^2$-$10^3$ J/m$^3$. For example, the first magnetic layer 10 may be formed of CoPt, FePt, or an alloy thereof, and the second magnetic layer 20 may be formed of Ni, Co, NiCo, NiFe, CoFe, CoZrNb, or CoZrCr. The second magnetic layer 20 may be formed on a surface of the first magnetic layer 10 which faces the storage track 300 or on an opposite surface to a thickness of 5 to 100 nm. The second magnetic layer 20 may be formed, for example, at the first end E1 or the second end E2 of the first magnetic layer 10. The position of the second magnetic layer 20 may vary. In addition, the second magnetic layer 20 may be preferably formed to have the same width as or a greater width than the first magnetic layer 10, but may also be formed to have a smaller width than the first magnetic layer 10.

The magnetization direction of the second magnetic layer 20 having a relatively small magnetic anisotropic energy is likely to be reversed by an external magnetic field, and thus the second magnetic layer 20 functions as an initiator reversing the magnetization direction of the portion of the first magnetic layer 10 where the first magnetic layer 10 is in contact with the second magnetic layer 20. Thus the region of the first magnetic layer 10 in contact with the second magnetic layer 20 can be reversed more easily than the rest region of the first magnetic layer 10. Using this principle, magnetic domains magnetized in different directions can be formed in the first magnetic layer 10.

Also, since the thickness of the portion of the writer 100 where the second magnetic layer 20 is formed is greater than the thickness of the rest of the writer 100, when a current is applied to the writer 100, the density of the current in the portion of the writer 100 where the second magnetic layer 20 is formed is reduced. Thus the movement of the magnetic domain wall W may be stopped in the portion of the first magnetic layer 10 where the second magnetic layer 20 is formed. That is, as illustrated in FIG. 2B in which the second magnetic layer 20 is formed at the first end E1 of the first magnetic layer 10 and the magnetic domain wall W is moved in a direction from the second end E2 to the first end E1 of the first magnetic layer 10, the movement of the magnetic domain wall W may be stopped at the boundary of the portion of the first magnetic layer 10 on which the second magnetic layer 20 is formed and the rest of the first magnetic layer 10. Thus the magnetic domain wall W is prevented from disappearing through the first magnetic layer 10. Meanwhile, in order to prevent the magnetic domain wall W from disappearing through the second end E2 of the first magnetic layer 10, the second end E2 of the first magnetic layer 10 may be formed to have a relatively greater width than the rest of the first magnetic layer 10. The width of the first end E1 of the first magnetic layer 10 may also be formed relatively greater than the rest of the first magnetic layer 10 except the second end E2 of the first magnetic layer 10. Also, the first end E1 and the second end E2 of the first magnetic layer 10 may have different sizes and widths.

The structure of the information storage device according to the current embodiment of the present invention may be modified in various manners, and thus the writer 100 may have various structures as well. For example, the information storage device according to the current embodiment of the present invention may have a structure as illustrated in FIG. 3. That is, FIG. 3 is a perspective view illustrating an information storage device according to another exemplary embodiment of the present invention.

Referring to FIG. 3, a writer 150 includes first and second magnetic layers 15 and 25. The first magnetic layer 15 includes fifth through seventh magnetic domains D5, D6, and D7, and the second magnetic layer 25 is formed on a central region of the first magnetic layer 15. The fifth and seventh magnetic domains D5 and D7 are magnetized in the opposite direction to the sixth magnetic domain D6. A first magnetic domain wall W1 and a second magnetic domain wall W2 are formed between the fifth magnetic domain D5 and the sixth magnetic domain D6 and between the sixth magnetic domain D6 and the seventh magnetic domain D7, respectively. First and second intermediate layers 200a and 200b are formed on both sides of the second magnetic layer 25, respectively, with a distance therebetween, and first and second storage tracks 300a and 300b are formed on the first and second intermediate layers 200a and 200b, respectively. Though not illustrated in FIG. 3, a conductive line connected to both ends and the center of the first magnetic layer 15 may be formed, and a conductive line connected to both ends of each of the first and second storage tracks 300a and 300b may be formed. After moving the first or second magnetic domain wall W1 or W2 and applying a current from the first or second storage track 300a or 300b to the writer 150, predetermined data can be recorded to the first or second storage track 300a or 300b.

At least one of the first end, the second end, and the center of the first magnetic layer 15 in the writer 150 in the information storage device of FIG. 3 may be formed to have a greater width than the rest of the first magnetic layer 15 except the first end, the second end, and the center of the first magnetic layer 15.

The first magnetic layer of the writer included in the information storage device according to another exemplary embodiment of the present invention may have four or more magnetic domains, and two or more second magnetic layers may be provided on the first magnetic layer. The number of the magnetic domains included in the first magnetic layer is varies depending on the number of the second magnetic layer.

Meanwhile, a plurality of the first magnetic layers 10 and 15 may be included in the information storage devices of FIGS. 1 and 3 respectively, and may be arranged parallel to each other. For example, referring to FIG. 1, a plurality of structures each including the writer 100, the intermediate layer 200, and the storage track 300 may be arranged parallel to each other in a Y direction; and referring to FIG. 3, a plurality of structures each including the writer 150, the first and second intermediate layers 200a and 200b, and the first and second storage tracks 300a and 300b may be arranged parallel to each other in a Y-direction. In this case, a portion of each of the first magnetic layers 10 and 15 may be formed adjacent to one another, having a greater width than the rest of the region of the first magnetic layers 10 and 15, and the second magnetic layers 20 and 25 are formed to cover the above portion.

FIGS. 4A through 4F are perspective views illustrating various structures of a writer that can be included in the information storage device of the present invention. Description about the writer illustrated in FIGS. 4A through 4F is included in the above description on the writer, and thus repeated description will be omitted. Referring to FIGS. 4A through 4F, reference numerals 10a through 10c and 15a through 15c denote first magnetic layers, and reference numerals 20a through 20c and 25a through 25c denote second magnetic layers.

Hereinafter, a method of forming a writer 100 included in the information storage device according to an exemplary embodiment of the present invention will be described.

Figure 5A:
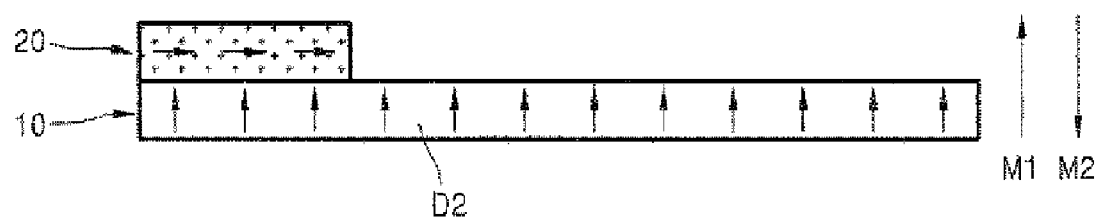
FIGS. 5A and 5B are cross-sectional views illustrating a method of forming a writer included in an information storage device, according to an embodiment of the present invention.
Figure 5B:
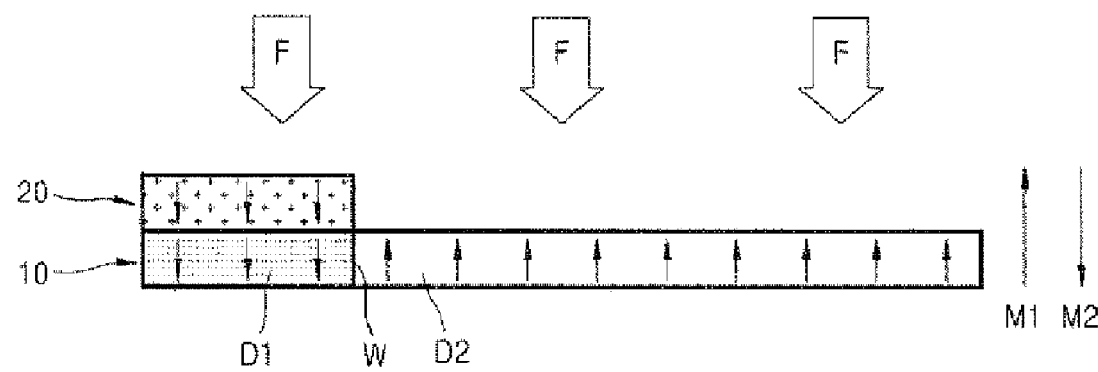

FIGS. 5A and 5B are cross-sectional views illustrating a method of forming a writer included in an information storage device, according to an exemplary embodiment of the present invention.

Referring to FIG. 5A, a first magnetic layer 10 and a second magnetic layer 20 covering a portion of the first magnetic layer 10 are formed on a substrate (not shown). The second magnetic layer 20 has a smaller magnetic anisotropic energy than the first magnetic layer 10. The first magnetic layer 10 may be formed to have perpendicular magnetic anisotropy while being formed, and the second magnetic layer 20 may be formed to have horizontal magnetic anisotropy while being formed. The first magnetic layer 10 is formed of a second magnetic domain D2 magnetized in a first direction M1.

Referring to FIG. 5B, a magnetic field F in a second direction M2 is applied to the first and second magnetic layers 10 and 20. The magnetic field F is controlled to be sufficiently strong to reverse the direction of the magnetization of the portion of the first magnetic layer 10 on which the second magnetic layer 20 is formed, but not to reverse the direction of the magnetization of the portion of the first magnetic layer 10 where the second magnetic layer 20 is not formed. The intensity of the magnetic field F varies according to the type and thickness of the first and second magnetic layers 10 and 20. As a result, the magnetization direction of the second magnetic layer 20 may be reversed first, and then the portion of the first magnetic layer 10 on which the second magnetic layer 20 is formed may be reversed, by an influence of the second magnetic layer 20. However, the magnetization direction of the portion of the first magnetic layer 10 where the second magnetic layer 20 is not formed may be not reversed. As a result, a first magnetic domain D1 may be formed in the portion of the first magnetic layer 10 on which the second magnetic layer 20 is formed, and a magnetic domain wall W may be created between the first and second magnetic domains D1 and D2.

In one embodiment, it is possible that the first magnetic layer 10 has perpendicular magnetic anisotropy and the second magnetic layer 20 has horizontal magnetic anisotropy, or the first magnetic layer 10 has horizontal magnetic anisotropy and the second magnetic layer 20 has perpendicular magnetic anisotropy. In other embodiment, the first and second magnetic layers 10 and 20 may have the same magnetic anisotropy. Also, at least one of the first and second magnetic layers 10 and 20 may not have magnetic anisotropy while being formed. In this case, a set of two external magnetic fields needs to be applied to form magnetic domains magnetized in opposite directions in the first magnetic layer 10. Hereinafter, a method of forming a writer by applying the external magnetic field twice will be described.

Figure 6A:
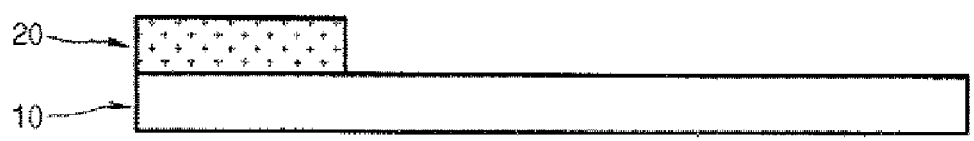
FIGS. 6A through 6C are cross-sectional views illustrating a method of forming a writer included in an information storage device, according to another embodiment of the present invention.
Figure 6B:
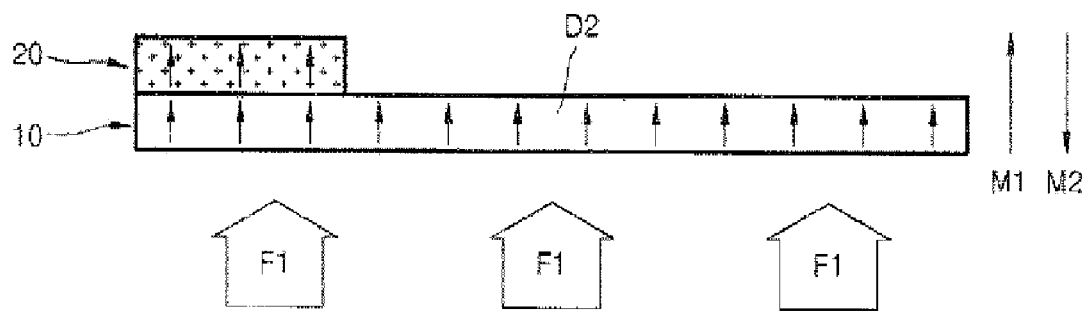
Figure 6C:
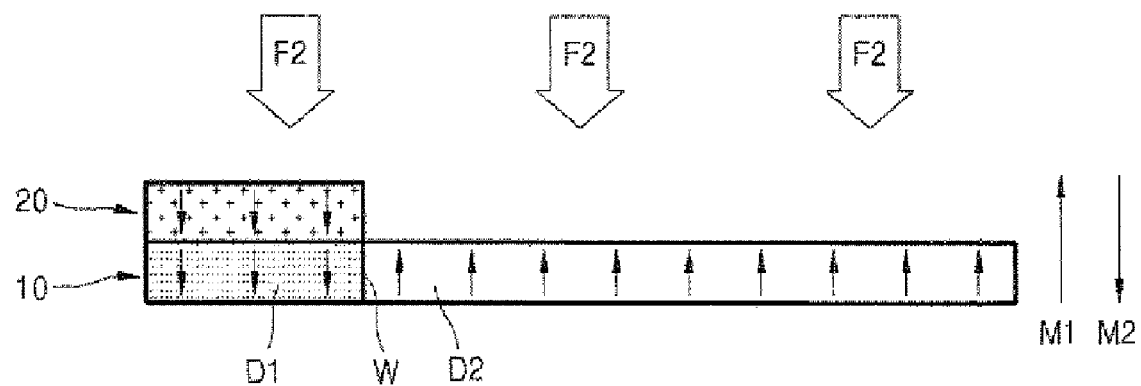

FIGS. 6A through 6C are cross-sectional views illustrating a method of forming a writer included in an information storage device, according to another exemplary embodiment of the present invention.

Referring to FIG. 6A, a first magnetic layer 10 and a second magnetic layer 20 covering a portion of the first magnetic layer 10 are formed on a substrate (not shown). The first and second magnetic layers may be formed by employing various methods known in the art, such as physical vapor deposition method or chemical vapor deposition method. The second magnetic layer 20 has a smaller magnetic anisotropic energy than the first magnetic layer 10. The first and second magnetic layers 10 and 20 may not be subject to a treatment to provide them with magnetic anisotropy during their formation.

Referring to FIG. 6B, a first magnetic field F1 in a first direction M1 is applied to the first and second magnetic layers 10 and 20. Here, the first magnetic field F1 has sufficiently high intensity to magnetize the first magnetic layer 10. As a result, the first magnetic layer 10 is magnetized in the first direction M1, creating a second magnetic domain D2.

Referring to FIG. 6C, a second magnetic field F2 that is in the opposite direction to the first magnetic field F1 and has a smaller intensity than the first magnetic field F1 is applied to the first and second magnetic layers 10 and 20. The second magnetic field F2 is sufficiently strong to reverse the direction of the magnetization of the portion of the first magnetic layer 10 on which the second magnetic layer 20 is formed, but is not strong enough to reverse the direction of the magnetization of the portion of the first magnetic layer 10 where the second magnetic layer 20 is not formed. The intensity of the first and second magnetic fields F1 and F2 varies according to the type and thickness of the first and second magnetic layers 10 and 20. That is, the magnetization direction of the second magnetic layer 20 may be reversed first, and then the portion of the first magnetic layer 10 on which the second magnetic layer 20 is formed may be reversed, by an influence of the second magnetic layer 20. That is, the second magnetic layer 20 whose magnetization direction can be easily reversed initiates the reversion of the magnetization of the portion of the first magnetic layer 20 on which the second magnetic layer 10 is formed. However, the magnetization direction of the portion of the first magnetic layer 10 where the second magnetic layer 20 is not formed may be not reversed. As a result, a first magnetic domain D1 is formed in the portion of the first magnetic layer 10 on which the second magnetic layer 20 is formed, and a magnetic domain wall W is created between the first and second magnetic domains D1 and D2.

Meanwhile, the time at which the magnetic field F, and the first and second magnetic fields F1 and F2 are applied may vary. In FIGS. 5A, 5B, and 6A through 6C, the fields F, F1, and F2 are applied before forming an intermediate layer on the writer, but the fields F, F1, and F2 may be applied after the intermediate layer is formed. Thus, the magnetic domain wall W can be formed by applying the magnetic field F or the first and second magnetic field F1 and F2 in any step of the fabrication of the information storage device, for example after the second magnetic layer 20 is formed, or prior to the initial operation of the information storage device after the fabrication is done. When the magnetic domain wall W is formed after the information storage device is fabricated and prior to the initial operation, the formation of the magnetic domain wall W is a preliminary process for the operation of the information storage device. The preliminary process can be performed only once. After forming the magnetic domain wall W, the writing operation of the information storage device according to the current embodiment of the present invention is the same as the writing operation described with reference to FIGS. 2A through 2D.

Although information storage devices including first magnetic layers 10 and 15, intermediate layers 200, 200a, and 200b, and storage tracks 300, 300a, and 300b are described above, a information storage device according to another exemplary embodiment of the present invention may do not include an intermediate layer. For example, a first magnetic layer and a storage track may be formed in a single layer without an intermediate layer. However, an intermediate layer can be disposed between the first magnetic layer and the storage track. In this case, data can be recorded to the storage track by moving a magnetic domain wall in the first magnetic layer and the storage track. FIG. 7 shows an example of such a single layer form of the device. In FIG. 7, the reference numerals 10, 20, 100, 300 and C1'-C3' denote the first magnetic layer, the second magnetic layer, the writer, the storage track and the first through third conductive lines, respectively. Accordingly, the scope of the present invention is not limited to the information storage devices illustrated in FIGS. 1 and 3.

In addition, referring to FIGS. 1 and 3, the principle of the present invention can also be applied to the first magnetic layers 10 and 15, the intermediate layers 200, 200a, and 200b, and the storage tracks 300, 300a, and 300b having horizontal magnetic anisotropy instead of perpendicular magnetic anisotropy.

As described above, according to the present invention, at least one magnetic domain wall can be formed in a first magnetic layer of a writer, and the disappearance of the magnetic domain wall can be prevented. In the information storage device of the present invention, data can be easily recorded in a storage track by moving the magnetic domain walls in the first magnetic layer and the storage track. The above recording operation is independent of the property and dimension of the magnetic layer to which data is to be recorded.

Accordingly, according to the present invention, the operation of the information storage device using movement of the magnetic domain wall can be improved and the recording density of the information storage device can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An information storage device using movement of a magnetic domain wall comprising: a storage track having magnetic domains which each have a magnetization direction and a writer which records data to the storage track, wherein the writer comprises:
   a first magnetic layer; and
   a second magnetic layer that is provided to be in contact with a portion of the first magnetic layer and has a smaller magnetic anisotropic energy than the first magnetic layer.

2. The information storage device of claim 1, which is a laminate of the storage track and the writer, and further comprises a third layer which is disposed between the storage track and the first magnetic layer, wherein the third layer is in contact with a portion of the storage track and with a portion of the first magnetic layer, and has a smaller magnetic anisotropic energy than the storage track and the first magnetic layer.

3. The information storage device of claim 1, which is in a form of a single layer, in which the storage track and the first magnetic layer are arranged on a single layer.

4. The information storage device of claim 3, further comprises a third layer which is disposed between the storage track and the first magnetic layer, wherein the third layer is in contact with a portion of the storage track and with a portion of the first magnetic layer, and has a smaller magnetic anisotropic energy than the storage track and the first magnetic layer.

5. The information storage device of claim 1, wherein a magnetization direction of the portion of the first magnetic layer, where the first magnetic layer is in contact with the second magnetic layer, is opposite to a magnetization direction of a rest of the first magnetic layer where the second magnetic layer is not in contact with, and the first magnetic layer has a magnetic domain wall moving characteristic.

6. The information storage device of claim 1, wherein a plurality of identical second magnetic layers are provided, and the number of magnetic domains included in the first magnetic layer varies according to the number of the second magnetic layers.

7. The information storage device of claim 1, wherein the second magnetic layer is provided at an end of the first magnetic layer, and the first magnetic layer has two magnetic domains magnetized in opposite directions to each other.

8. The information storage device of claim 1, wherein the second magnetic layer is provided in the center of the first magnetic layer and the first magnetic layer has three magnetic domains.

9. The information storage device of claim 1, wherein at least two second magnetic layers are provided, and the first magnetic layer has at least four magnetic domains.

10. The information storage device of claim 1, wherein the portion of the first magnetic layer where the second magnetic layer is provided has a greater width than a portion of the first magnetic layer where the second magnetic layer is not formed.

11. The information storage device of claim 1, wherein at least one of a first end and a second end of the first magnetic layer has a greater width than the remaining region of the first magnetic layer except for the first end or the second end.

12. The information storage device of claim 1, wherein the magnetic anisotropic energy of the first magnetic layer is $2 \times 10^3 \text{-} 10^7$ J/m$^3$.

13. The information storage device of claim 1, wherein the magnetic anisotropic energy of the second magnetic layer is $10 \text{-} 10^3$ J/m$^3$.

14. The information storage device of claim 1, wherein the second magnetic layer is formed of one selected from the group consisting of Ni, Co, NiCo, NiFe, CoFe, CoZrNb, and CoZrCr.

15. The information storage device of claim 1, wherein the thickness of the second magnetic layer is 5-100 nm.

16. The information storage device of claim 1, wherein the second magnetic layer is provided on or under the first magnetic layer.

17. The information storage device of claim 2, which comprises a plurality of structures each comprise the storage track and the writer, wherein the first magnetic layers are identical to each other and the structures are arranged parallel.

18. The information storage device of claim 17, wherein a portion of each of the first magnetic layers has a greater width than the rest the first magnetic layer and is in contact with one another, and the second magnetic layer is provided on the portions of the first magnetic layers and covers the portions.

19. The information storage device of claim 1, further comprising a current applying device connected to the storage track and the writer.

20. A method of manufacturing an information storage device using movement of a magnetic domain wall comprising: a storage track having magnetic domains which each have a magnetization direction; and a writer which records data to the storage track, which comprises
forming the writer; and
forming the storage track,
wherein forming the writer comprises forming a first magnetic layer; and forming a second magnetic layer which is provided to be in contact with a portion of the first magnetic layer and has a smaller magnetic anisotropic energy than the first magnetic layer.

21. The method of claim 20, further comprising, after forming the first and second magnetic layers:
applying a first magnetic field to the first and second magnetic layers; and
applying a second magnetic field, that is opposite in direction to the first magnetic field and is smaller in intensity than the first magnetic field, to the first and second magnetic layers.

22. The method of claim 21, wherein the first magnetic field magnetizes the first magnetic layer in a first direction, and the second magnetic field magnetizes the portion of the first magnetic layer, where the first magnetic layer is in contact with the second magnetic layer, in a second direction that is opposite to the first direction.

23. The method of claim 20, wherein the first magnetic layer is magnetized in a first direction.

24. The method of claim 23, further comprising, after forming the first and second magnetic layers:
applying a magnetic field to the first and second magnetic layers, the magnetic field being in a direction opposite to the first direction.

25. The method of claim 24, wherein the magnetic field has an intensity which selectively reverses the magnetization direction of the portion of the first magnetic layer where the first magnetic layer is in contact with the second magnetic layer.

26. The method of claim 20, wherein the magnetic anisotropic energy of the first magnetic layer is $2 \times 10^3$-$10^7$ J/m$^3$.

27. The method of claim 20, wherein the magnetic anisotropic energy of the second magnetic layer is 10-$10^3$ J/m$^3$.

28. The method of claim 20, wherein the second magnetic layer is formed of one selected from the group consisting of Ni, Co, NiCo, NiFe, CoFe, CoZrNb, and CoZrCr.

29. A method of operating an information storage device using movement of a magnetic domain wall comprising: a storage track having magnetic domains which each have a magnetization direction; and a writer which records data to the storage track,
wherein the writer comprises a first magnetic layer and a second magnetic layer that is provided to be in contact with a portion of the first magnetic layer and has a smaller magnetic anisotropic energy than the first magnetic layer,
the method comprising:
(a) forming a magnetic domain wall in the first magnetic layer;
(b) applying a first current to the first magnetic layer to move the magnetic domain wall; and
(c) applying a second current to the writer through the storage track.

30. The method of claim 29, wherein (a) comprises:
applying a first magnetic field to the first and second magnetic layers; and
applying a second magnetic field, which is opposite in direction to the first magnetic field and is smaller in intensity than the first magnetic field, to the first and second magnetic layers.

31. The method of claim 30, wherein the first magnetic field magnetizes the first magnetic layer in a first direction, and the second magnetic field magnetizes the portion of the first magnetic layer, where the first magnetic layer is in contact with the second magnetic layer, in a second direction that is opposite to the first direction.

32. The method of claim 29, wherein (a) comprises:
applying a magnetic field to the first and second magnetic layers.

33. The method of claim 32, wherein the magnetic field has a direction and an intensity which selectively reverse the magnetization direction of the portion of the first magnetic layer, where the first magnetic layer is in contact with the second magnetic layer.

* * * * *